US010950673B2

(12) United States Patent
Bae et al.

(10) Patent No.: US 10,950,673 B2
(45) Date of Patent: Mar. 16, 2021

(54) DISPLAY DEVICE STRUCTURE FOR REDUCING DEFECTS

(71) Applicant: SAMSUNG DISPLAY CO., LTD., Yongin-si (KR)

(72) Inventors: Chulmin Bae, Yongin-si (KR); Changok Kim, Yongin-si (KR); Jihye Han, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/217,547

(22) Filed: Dec. 12, 2018

(65) Prior Publication Data

US 2019/0348482 A1 Nov. 14, 2019

(30) Foreign Application Priority Data

May 14, 2018 (KR) ........................ 10-2018-0055044

(51) Int. Cl.
*H01L 27/32* (2006.01)
*H01L 51/52* (2006.01)

(52) U.S. Cl.
CPC ...... *H01L 27/3246* (2013.01); *H01L 27/3248* (2013.01); *H01L 51/5218* (2013.01); *H01L 2251/301* (2013.01); *H01L 2251/303* (2013.01); *H01L 2251/558* (2013.01)

(58) Field of Classification Search
CPC ............. H01L 27/3295; H01L 27/3246; H01L 27/3283
See application file for complete search history.

(56) References Cited

U.S. PATENT DOCUMENTS

| 8,946,720 B2 | 2/2015 | Kwon et al. |
| 9,123,675 B2 | 9/2015 | Kim et al. |
| 2008/0224607 A1* | 9/2008 | Matsuo ............... H01L 27/3211 313/505 |
| 2009/0315027 A1 | 12/2009 | Kidu et al. |
| 2012/0012828 A1 | 1/2012 | Koh et al. |
| 2018/0240822 A1* | 8/2018 | Lee .................... H01L 27/1255 |

FOREIGN PATENT DOCUMENTS

| KR | 10-2005-0068844 A | 7/2005 |
| KR | 10-1119046 B1 | 2/2012 |
| KR | 10-2015-0003009 A | 1/2015 |
| KR | 10-2017-0124111 A | 11/2017 |

* cited by examiner

*Primary Examiner* — Laura M Menz
*Assistant Examiner* — Candice Chan
(74) *Attorney, Agent, or Firm* — Kile Park Reed & Houtteman PLLC (57) ABSTRACT

Provided is a display device including an organic insulating layer; a pixel electrode on the organic insulating layer; a pixel defining layer configured to cover an edge of the pixel electrode, having an opening corresponding to the pixel electrode, the pixel defining layer including a first layer including an inorganic insulating material and a second layer having less light transmittance in a first wavelength band than the first layer; an intermediate layer on a portion of the pixel electrode exposed via the opening, and including an emission layer; and an opposite electrode on the intermediate layer.

11 Claims, 8 Drawing Sheets

DISPLAY DEVICE STRUCTURE FOR REDUCING DEFECTS

CROSS-REFERENCE TO RELATED APPLICATION

Korean Patent Application No. 10-2018-0055044, filed on May 14, 2018, in the Korean Intellectual Property Office, and entitled: "Display Device," is incorporated by reference herein in its entirety.

BACKGROUND

1. Field

Embodiments relate to a display device.

2. Description of the Related Art

Organic light-emitting display devices do not require an additional light source and thus can be driven with a low voltage and manufactured to be light and thin. Also, the organic light-emitting display devices have favorable characteristics such as a wide viewing angle, high contrast, and a fast response speed and thus have drawn the attention as a next-generation display device.

SUMMARY

Embodiments are directed to a display device, including an organic insulating layer, a pixel electrode on the organic insulating layer, and a pixel defining layer that covers an edge of the pixel electrode. The pixel defining layer has an opening corresponding to the pixel electrode. The pixel defining layer includes a first layer including an inorganic insulating material and a second layer having less light transmittance in a first wavelength band than the first layer, an intermediate layer on a portion of the pixel electrode exposed via the opening, the intermediate layer including an emission layer, and an opposite electrode on the intermediate layer.

The first wavelength band may be in a range of 10 nm to 400 nm.

The light transmittance of the second layer in the first wavelength band may be 2% or less.

The pixel electrode may be a first pixel electrode. The display device may further include a second pixel electrode neighboring the first pixel electrode. A portion of the organic insulating layer exposed between the first pixel electrode and the second pixel electrode may be entirely covered by the second layer.

The first layer may include at least one of silicon oxide and silicon nitride.

The second layer may include amorphous silicon.

The second layer may include an amorphous silicon layer having a thickness that is 1,000 Å or greater.

The second layer may include an amorphous carbon-based material that absorbs light in the first wavelength band. The amorphous carbon-based material excludes diamond-like carbon (DLC).

The first layer may be between the organic insulating layer and the second layer. A portion of the first layer may directly contact the organic insulating layer.

The display device may further include a third layer on the second layer. The third layer may include an inorganic insulating material. The second layer may be between the first layer and the third layer.

The second layer may include a first sub-layer and a second sub-layer. A sub-layer closer to the organic insulating layer from among the first sub-layer and the second sub-layer may have a larger light absorption rate than the other sub-layer.

Embodiments are also directed to a display device, including a substrate, a thin-film transistor on the substrate, an organic insulating layer that covers the thin-film transistor, a pixel electrode electrically connected to the thin-film transistor via a contact hole of the organic insulating layer, a pixel defining layer that covers an edge of the pixel electrode, the pixel defining layer having an opening corresponding to the pixel electrode, and the pixel defining layer including a first layer and a second layer, the second layer having less light transmittance in a first wavelength band than the first layer, a spacer on the pixel defining layer, an intermediate layer on a portion of the pixel electrode exposed via the opening, the intermediate layer including an emission layer, and an opposite electrode on the intermediate layer.

The pixel electrode may be a first pixel electrode. The display device further includes a second pixel electrode. A portion of the organic insulating layer exposed between the first pixel electrode and the second pixel electrode may be entirely covered by the second layer.

The first wavelength band may be in a range of 10 nm to 400 nm.

The light transmittance of the second layer in the first wavelength band may be 2% or less.

The display device may further include a third layer that covers the second layer, the second layer being between the first layer and the third layer.

The first layer and the third layer may include an inorganic insulating material having greater light transmittance in the first wavelength band than the second layer.

A portion of the first layer may directly contact the organic insulating layer.

The second layer may include at least one of amorphous silicon and an amorphous carbon-based material, excluding diamond-like carbon (DLC).

The second layer may include a first sub-layer and a second sub-layer. A sub-layer closer to the organic insulating layer from among the first sub-layer and the second sub-layer may have a larger light absorption rate than the other sub-layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

Figure 1:
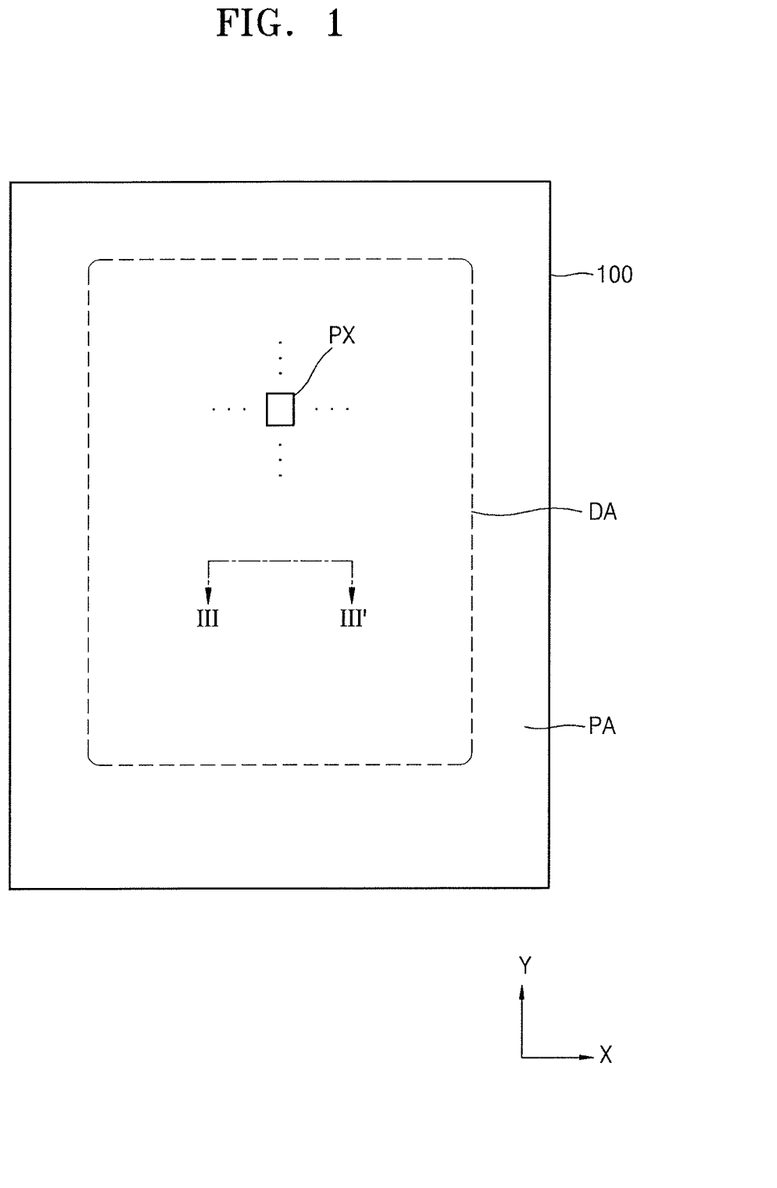
FIG. 1 illustrates a schematic plan view of a display device according to an embodiment.

FIG. 1 illustrates a plan view of a display device according to an embodiment.

Referring to FIG. 1, the display device includes a substrate 100. The substrate 100 may include a display area DA and a peripheral area PA around the display area DA.

A plurality of pixels PX may be arranged on the display area DA. Each pixel may include a pixel circuit including a thin-film transistor, a storage capacitor, or the like, electrically connected to a signal line and a power line, and a display element connected to the pixel circuit, for example, an organic light-emitting diode (OLED).

The pixel PX may emit, for example, red light, green light, blue light, or white light via the OLED. The pixel PX as described herein may be understood as being a pixel that emits one of red light, green light, blue light, and white light, as described above. The display area DA may be covered with an encapsulation layer and thus may be protected from ambient air, moisture, or the like. When the display element included in the pixel PX is an OLED, at least a storage capacitor and at least a driving thin-film transistor and a switching thin-film transistor may be included in the pixel PX.

Figure 2:
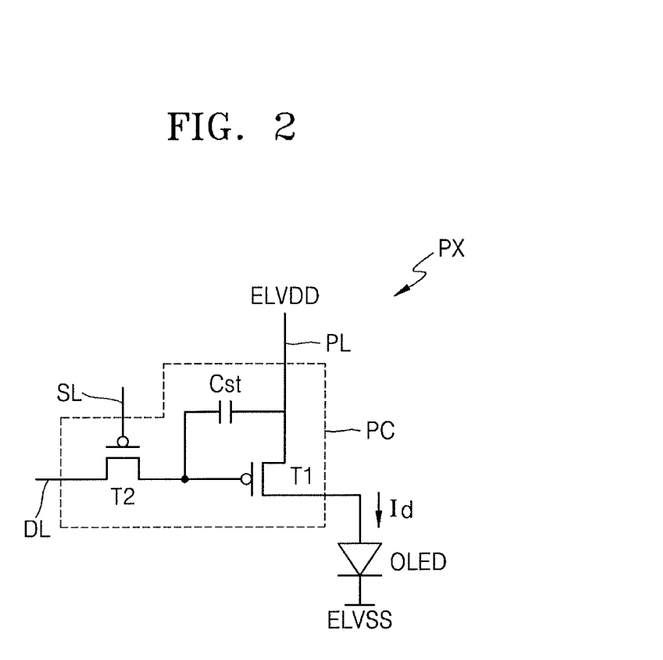
FIG. 2 illustrates an equivalent circuit diagram of a pixel of a display device according to an embodiment.

FIG. 2 illustrates an equivalent circuit diagram of a pixel of a display device according to an embodiment.

Referring to FIG. 2, the pixel PX includes a pixel circuit PC and a display element connected to the pixel circuit PC. FIG. 2 illustrates an OLED as the display element. The pixel circuit PC may include a first thin-film transistor T1, a second thin-film transistor T2, and a storage capacitor Cst.

The second thin-film transistor T2, which is a switching thin-film transistor, may be connected to a scan line SL and a data line DL and may transmit, a data voltage received via the data line DL to the first thin-film transistor T1 according to a switching voltage received via the scan line SL. The storage capacitor Cst may be connected to the second thin-film transistor T2 and a driving voltage line PL. The storage capacitor Cst may store a voltage corresponding to a difference between a voltage received from the second thin-film transistor T2 and a first power supply voltage ELVDD supplied to the driving voltage line PL.

The first thin-film transistor T1, which is a driving thin-film transistor, is connected to the driving voltage line PL and the storage capacitor Cst, and may control a driving current Id flowing from the driving voltage line PL to the OLED, according to a voltage value stored in the storage capacitor Cst. The OLED may emit light having a certain brightness according to the driving current Id. An opposite electrode (for example, a cathode) of the OLED may receive a second power supply voltage ELVSS.

A case where the pixel circuit PC includes two thin-film transistors and one storage capacitor is illustrated in FIG. 2. In some implementations, the number of thin-film transistors and the number of storage capacitors may vary according to a design of the pixel circuit PC.

Figure 3:
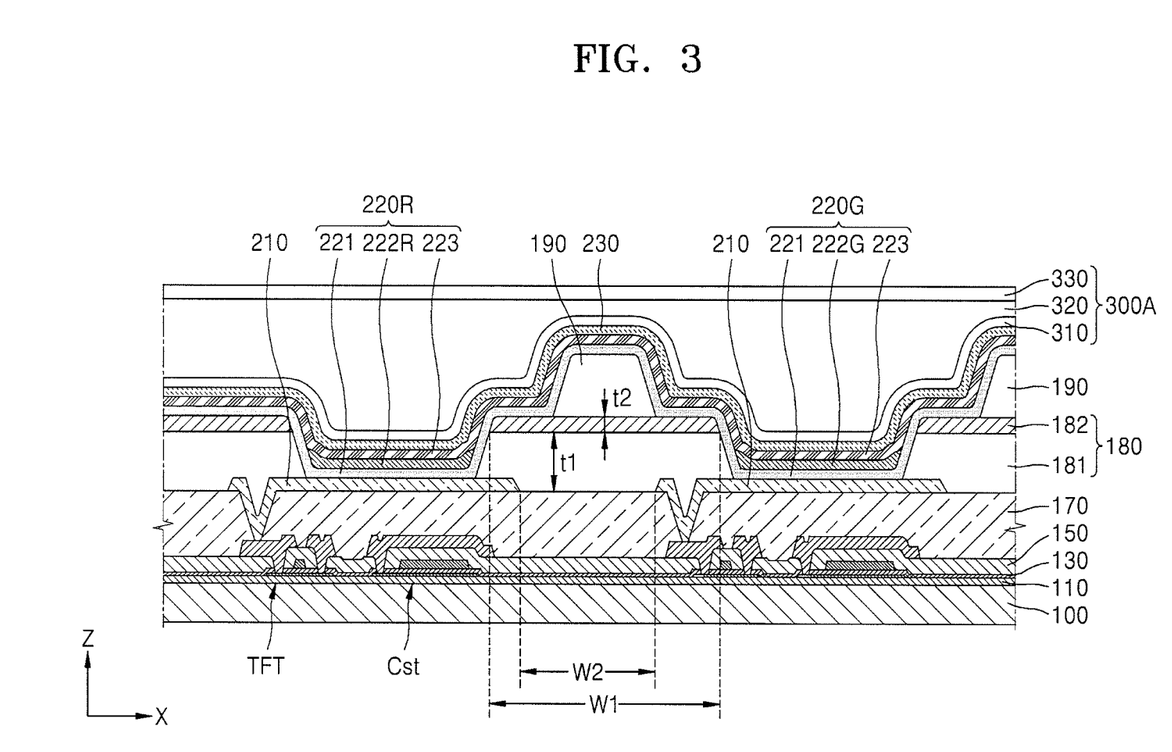
FIG. 3 illustrates a schematic cross-sectional view of a display device according to an embodiment.

FIG. 3 illustrates a cross-sectional view of a display device according to an embodiment. The cross-sectional view corresponds to a cross-section taken along line III-III' of FIG. 1.

Referring to FIG. 3, a thin-film transistor TFT and a storage capacitor Cst may be disposed on the substrate 100. The thin-film transistor TFT and the storage capacitor Cst may be covered by a planarization insulating layer 170.

The substrate 100 may include a polymer resin, such as polyether sulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

A buffer layer 110 to help prevent impurities from permeating into a semiconductor layer of the thin-film transistor TFT, a gate insulating layer 130 to insulate the semiconductor layer of the thin-film transistor TFT from a gate electrode of the thin-film transistor TFT, an interlayer insulating layer 150 to insulate source and drain electrodes of the thin-film transistor TFT from the gate electrode thereof, and a planarization insulating layer 170 to cover the thin-film transistor TFT may be formed on the substrate 100. The planarization insulating layer 170 may have an approximately flat top surface.

The buffer layer 110, the gate insulating layer 130, and the interlayer insulating layer 150 may include an inorganic insulating material, such as silicon oxide (SiOx), silicon nitride (SiNx), or silicon oxynitride (SiON). The planarization insulating layer 170 may include an organic insulating material. The organic insulating material may include at least one of acryl, benzocyclobutene (BCB), PI, or hexamethyl disiloxane (HMDSO), etc.

A pixel electrode 210 may be disposed on the planarization insulating layer 170. The pixel electrode 210 may be disposed in each pixel, and may be spaced apart from its neighboring (adjacent) pixel electrodes 210. For convenience of discussion, the pixel electrodes 210 shown on the left and on the right in FIGS. 3, 4, and 6 may be referred to collectively as neighboring pixel electrodes 210 or as a first pixel electrode and a second pixel electrode, respectively. The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In some implementations, the pixel electrode 210 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or a compound of these materials. In some implementations, the pixel electrode 210 may further include a film formed of ITO, IZO, ZnO, or $In_2O_3$ above/below the reflection layer.

The pixel defining layer 180 may cover an edge of the pixel electrode 210. The pixel electrode 210 may be exposed via an opening in the pixel defining layer 180. A spacer 190 may be located on the pixel defining layer 180. The spacer 190 may be an island type. A plurality of spacers 190 may be disposed spaced apart from each other in the display area DA. The spacers 190 may include an organic insulating material or/and an inorganic insulating material.

The pixel defining layer 180 may include two layers having different light transmittances in a first wavelength band. FIG. 3 illustrates that the pixel defining layer 180 includes a first layer 181 and a second layer 182.

The light transmittance of second layer 182 in the first wavelength band may be less than that of the first layer 181. The first wavelength band may include an ultraviolet (UV) wavelength band. The first wavelength band may be a wavelength band within a range of about 10 nm to about 400 nm. The light transmittance of the second layer 182 in the aforementioned first wavelength band may be less than or equal to, for example, about 3%, or, for example, may be less than or equal to about 2%.

The planarization insulating layer 170 below the pixel defining layer 180 may include an organic insulating material. When energy, such as heat or light, is applied to the organic insulating material during or after a manufacturing process of the display device, there is a possibility that a material included in the organic insulating material could be vaporized and discharged to the outside. This phenomenon is referred to as outgassing. A gas generated due to the outgassing could damage layers located on the planarization insulating layer 170, for example, intermediate layers 220R and 220G and an opposite electrode 230, causing an OLED of each pixel to become defective. However, according to an embodiment, the pixel defining layer 180 may include the second layer 182 having a low level of light transmittance in the first wavelength band. Accordingly, light in the first wavelength band may be prevented from traveling from the outside (for example from an upper side of FIG. 3) toward the planarization insulating layer 170. Thus, the above-described outgassing may be prevented or minimized.

The second layer 182 may entirely cover a portion of the planarization insulating layer 170 that is not overlapped by the pixel electrode 210. In this regard, FIG. 3 illustrates that a first width W1 of the second layer 182 is greater than a second width W2 of a portion of the planarization insulating layer 170 that is exposed between neighboring pixel electrodes 210. The second width W2 may be understood as a distance between the neighboring pixel electrodes 210. The portion of the planarization insulating layer 170 that is located between neighboring pixel electrodes 210 and is not covered by the pixel electrodes 210 may be entirely covered by the second layer 182. Accordingly, light in the first wavelength band traveling from the outside toward the planarization insulating layer 170 as described above may be effectively prevented from reaching the planarization insulating layer 170.

Figure 5:
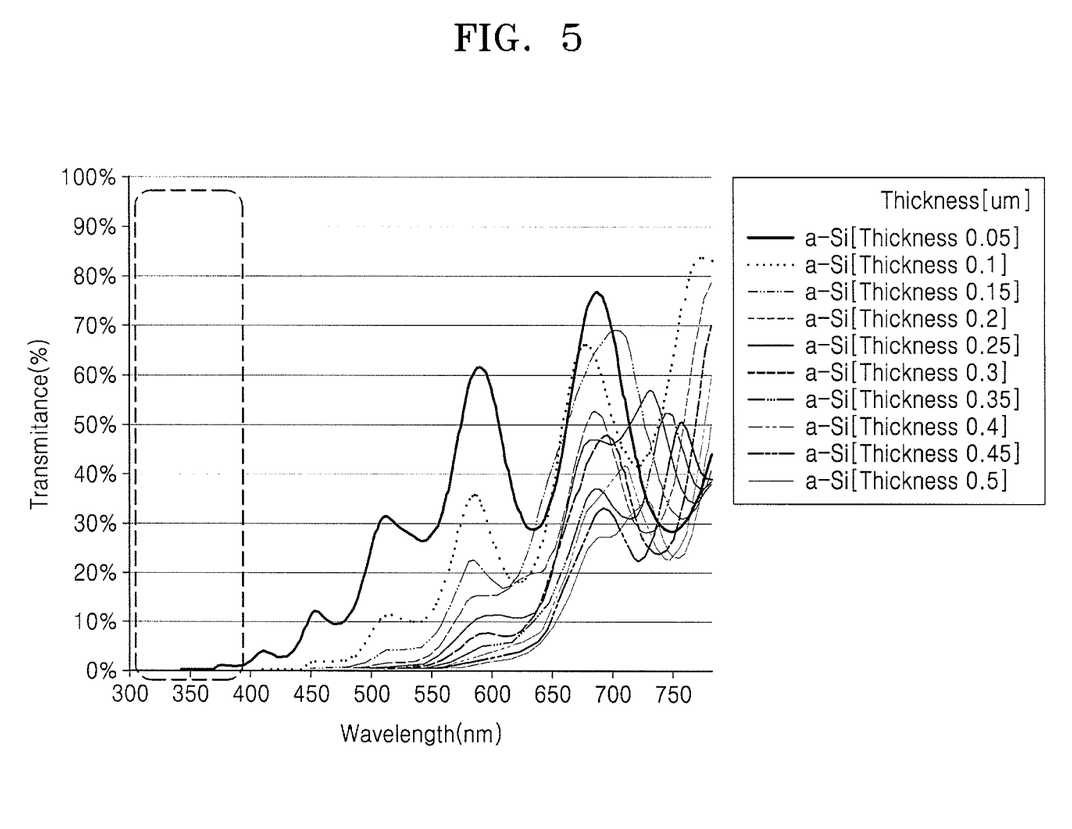
FIG. 5 illustrates a graph showing light transmittance according to thicknesses of an amorphous silicon layer.

The second layer 182 may include a material that absorbs or reflects the light in the first wavelength band. For example, the second layer 182 may include amorphous silicon having relatively large reflectance. When the second layer 182 includes an amorphous silicon layer, a thickness (corresponding to a second thickness t2 of the second layer 182) of the amorphous silicon layer may be formed to be about 1,000 Å or greater. FIG. 5 illustrates a graph showing light transmittance according to different thicknesses when the second layer 182 is an amorphous silicon layer. As shown in FIG. 5, a light transmittance in the first wavelength band may be controlled to be 2% or less. The second thickness t2 of the second layer 182 may be formed to be less than the first thickness t1 of the first layer 181.

The second layer 182 may include an amorphous carbon-based material having a relatively large light absorption rate. In this case, the second layer 182 including an amorphous carbon-based material may have a less thickness than the amorphous silicon layer. Herein, the term "amorphous carbon-based material" excludes diamond-like carbon (DLC).

The second layer 182 may include a mixture of the above-described amorphous silicon and the above-described amorphous carbon-based material, excluding DLC. For example, the amorphous carbon-based material, excluding DLC may have a reflectance of about 1% or less. In some implementations, the second layer 182 may include various types of materials other than the above-described amorphous silicon and the above-described amorphous carbon-based material (excluding DLC), as long as the materials are able to control the light transmittance in the first wavelength band to be about 2% or less. According to an implementation, the second layer 182 may include chromium oxide, etc.

The first layer 181 of the pixel defining layer 180 may include an inorganic insulating material. The first layer 181 may passivate the planarization insulating layer 170, which may include an organic insulating layer. The first layer 181 may include at least one of silicon oxide and silicon nitride. A portion of the first layer 181 may directly contact the top surface of the planarization insulating layer 170. In a comparative example, when the first layer 181 is formed of an organic insulating material, a gas generated in the planarization insulating layer 170 may travel along the first layer 181 formed of the organic insulating material and damage the intermediate layers 220R and 220G and the opposite electrode 230. However, according to the present embodiment, the first layer 181, which is a lowest layer of the pixel defining layer 180, may be formed of an inorganic insulating material. Accordingly, even if a small amount of gas were to be generated in the planarization insulating layer 170, the gas may be prevented from passing through the first layer 181 and traveling toward the intermediate layers 220R and 220G and/or the opposite electrode 230 disposed over the first layer 181. Accordingly, a defect may be prevented from occurring in the OLED.

The intermediate layers 220R and 220G are respectively located on respective portions of the pixel electrodes 210 exposed via the openings of the pixel defining layer 180. In this regard, FIG. 3 illustrates the intermediate layers 220R and 220G respectively disposed on the pixel electrodes 210 and emitting light of different colors.

The intermediate layers 220R and 220G may include emission layers 222R and 222G, respectively, including materials that respectively emit red light and green light. In some implementations, an OLED including an emission layer that emits blue light may be further included. A stack structure of a pixel including an OLED that emits blue light may be the same as that of each of the OLEDs of FIG. 3 respectively including the emission layers that respectively emit red light and green light.

Each of the intermediate layers 220R and 220G may include at least one of first and second functional layers 221 and 223 respectively disposed below and on each of the emission layers 222R and 222G.

The first functional layer 221 may be a single layer or a multi-layer. For example, when the first functional layer 221 is formed of a high molecular weight material, the first functional layer 221 may be a hole transport layer (HTL) having a single-layer structure. For example, the first functional layer 221 may be formed of poly-(3,4)-ethylenedihydroxy thiophene (PEDOT) or polyaniline (PANI). When the first functional layer 221 is formed of a low molecular weight material, the first functional layer 221 may include a hole injection layer (HIL) and an HTL.

The second functional layer 223 may cover the emission layers 222R and 222G. The second functional layer 223 may be optional. When the first functional layer 221 and the emission layers 222R and 222G are formed of low molecular weight materials, the second functional layer 223 may be provided to improve the characteristics of an OLED.

The second functional layer 223 may be a single layer or a multi-layer. The second functional layer 223 may include an electron transport layer (ETL), and/or an electron injection layer (EIL).

The opposite electrode 230 may be formed of a conductive material having a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy of these materials. In some implementations, the opposite electrode 230 may further include a layer, such as ITO, IZO, ZnO, or $In_2O_3$, on the (semi)transparent layer including any of the above-described materials.

According to an embodiment, the opposite electrode 230 may include Al, Ag, or an alloy of Al and Ag (Mg:Ag), etc.

An encapsulation member may be disposed on the opposite electrode 230. Examples of the encapsulation member may include a thin-film encapsulation layer 300A including at least one inorganic encapsulation layer and at least one organic encapsulation layer as shown in FIG. 3. As shown in FIG. 3, the thin-film encapsulation layer 300A may include first and second inorganic encapsulation layers 310 and 330 and an organic encapsulation layer 320 therebetween. In some implementations, a stacking order of an inorganic encapsulation layer(s) and an organic encapsulation layer(s) and the number of inorganic encapsulation layer(s) and organic encapsulation layer(s) may be changed.

Figure 4:
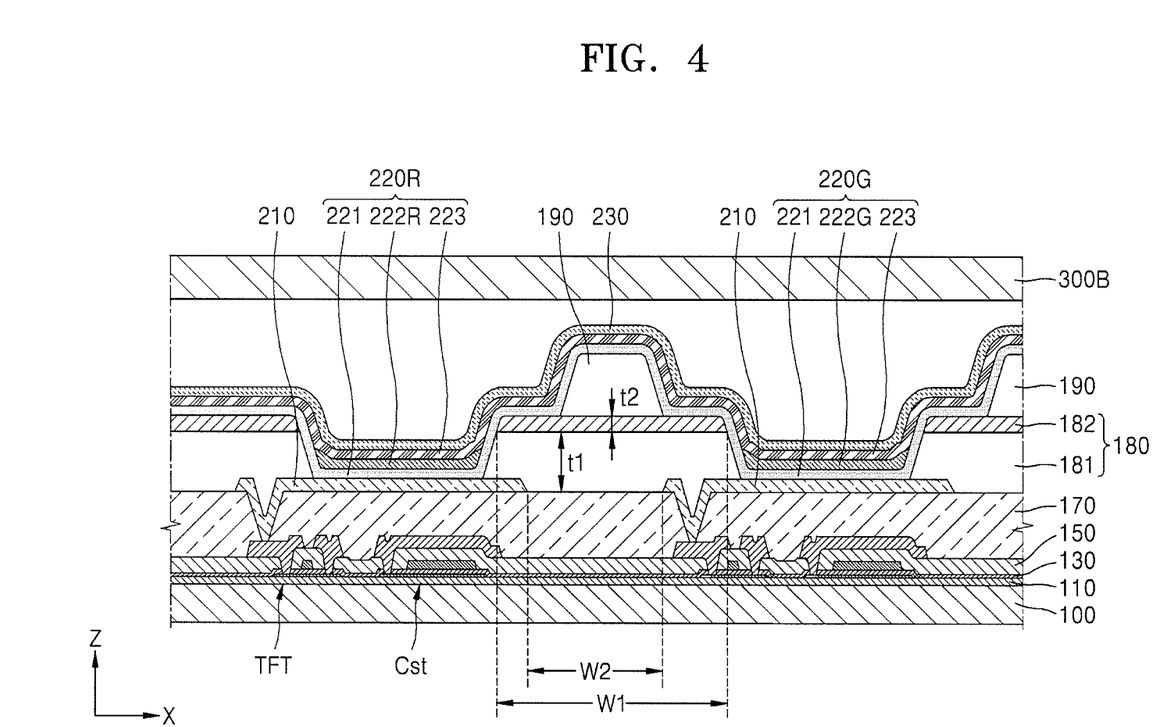
FIG. 4 illustrates a schematic cross-sectional view of a display device according to another embodiment.

According to an embodiment, the encapsulation member may include an encapsulation substrate 300B, as shown in FIG. 4. The encapsulation layer may be glass. In this case, the spacers 190 may maintain an interval between the substrate 100 and the encapsulation substrate 300B to be constant, thereby preventing or minimizing Newton's rings that could be caused by sagging of the encapsulation substrate 300B. When the encapsulation member is a flexible thin-film encapsulation layer 300A as shown in FIG. 3, the spacers 190 may support a mask that is used during formation of the emission layers 222R and 222G, thereby preventing or minimizing a defects that could occur during formation of the emission layers 222R and 222G if the mask were allowed to sag. A sealant that surrounds the display area may located between the substrate 100 and the encapsulation substrate 300B.

Figure 6:
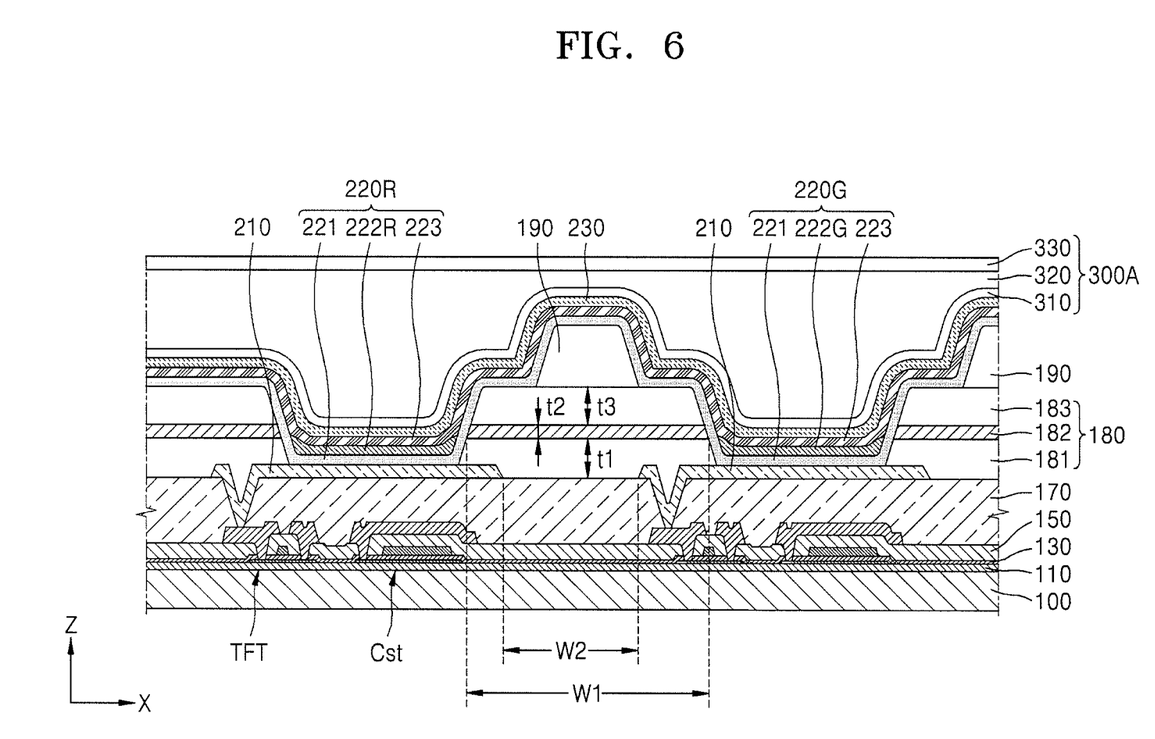
FIG. 6 illustrates a schematic cross-sectional view of a display device according to another embodiment.
Figure 7:
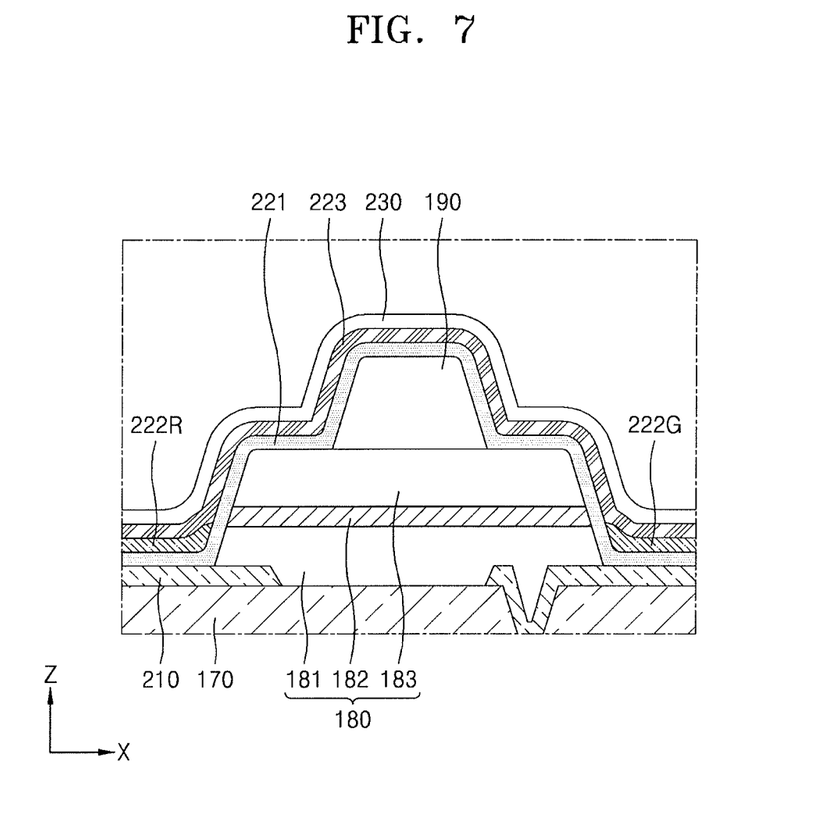
FIG. 7 illustrates a magnified view of a portion of the cross-section of FIG. 6.

FIG. 6 illustrates a cross-sectional view of a display device according to an embodiment. FIG. 7 illustrates a magnified view of a portion of the cross-section of FIG. 6.

In contrast with the display device of FIG. 3, the display device of FIG. 6 may include a pixel defining layer further including a third layer 183. The thin-film encapsulation layer 300A including the first and second inorganic encapsulation layers 310 and 330 and the organic encapsulation layer 320 therebetween is shown as an encapsulation member in FIG. 6. In some implementations, the encapsulation member may be an encapsulation substrate as described above with reference to FIG. 4. Components other than the pixel defining layer may be the same as those described above with reference to FIG. 3. Differences between the display devices of FIGS. 3 and 6 will now be focused on and described.

Referring to FIGS. 6 and 7, the pixel defining layer 180 may include the first layer 181, the second layer 182, and the third layer 183. As described above, the first layer 181 may cover an edge of the pixel electrode 210 disposed therebelow while contacting the edge of the pixel electrode 210. The first layer 181 may directly contact a portion of the planarization insulating layer 170 between neighboring pixel electrodes 210. The second layer 182 may have less light transmittance in the first wavelength band than the first layer 181. The second layer 182 may have the first width W1 greater than the second width W2, the second width W2 being the portion of the planarization insulating layer 170 exposed between the neighboring pixel electrodes 210. Detailed features related thereto are as described above. The materials and structure of the second layer 182, which help to prevent a defect of an OLED due to outgassing by blocking light heading from the outside to the planarization insulating layer 170, may be as described above.

The third layer 183 may be disposed on the second layer 182 such that the third layer 183 covers the second layer 182. Similar to the first layer 181, the third layer 183 may include at least one of materials having larger light transmittance in the first wavelength band than the second layer 182. For example, the third layer 183 may include silicon nitride and silicon oxynitride. When the third layer 183 covers the second layer 182, a material included in the second layer 182 may be prevented from affecting the intermediate layers 220R and 220G or the opposite electrode 230 during or after a process of manufacturing the display device. In addition, the third layer 183 may further passivate the planarization insulating layer 170, along with the first layer 181. Accordingly, an organic light-emitting defect due to outgassing may be effectively reduced or prevented.

The third layer 183 may include the same material as that used to form the spacers 190 disposed directly on the third layer 183. The spacers 190 and the third layer 183 may be patterned together in a same mask process using a halftone or the like.

The thickness t3 of the third layer 183 may be greater than the thickness t2 of the second layer 182. The thickness t1 of the first layer 181 may be greater than the thickness t2 of the layer 182. The thicknesses t1 and t3 of the first and third layers, 181 and 183, may be equal to each other or different from each other.

As shown in FIG. 7, respective lateral surfaces of the first layer 181, the second layer 182, and the third layer 183 sequentially stacked on one another may constitute a lateral surface of the pixel defining layer 180. A layer, for example, the first functional layer 221 included in an intermediate layer, may contact the respective lateral surfaces of the first layer 181, the second layer 182, and the third layer 183 constituting the lateral surface of the pixel defining layer 180.

Figure 8:
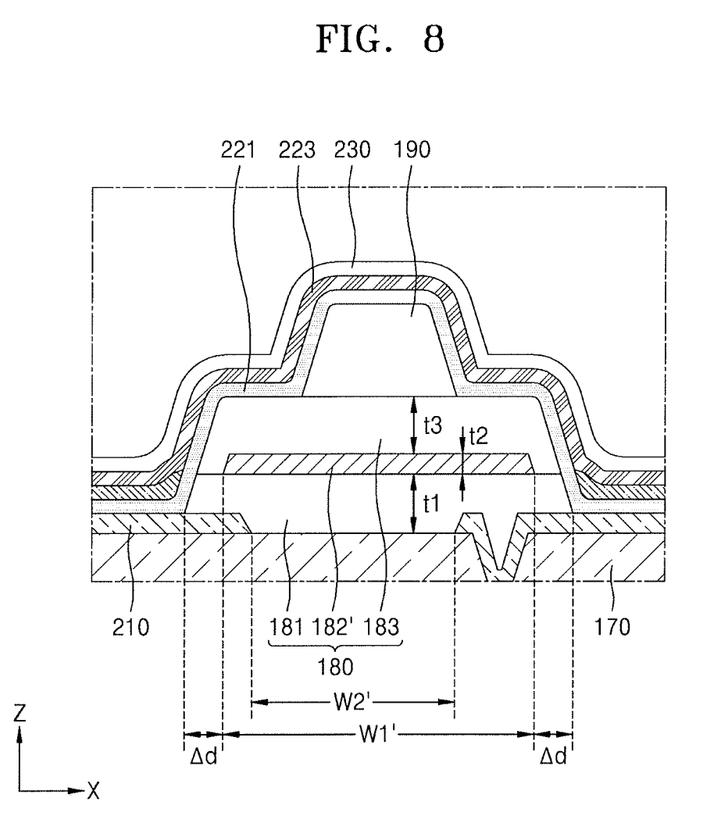
FIG. 8 illustrates a cross-sectional view of a modification of the embodiment of FIG. 7.

FIG. 8 illustrates a cross-sectional view of a modification of the embodiment of FIG. 7.

"Similar to the pixel defining layer 180 of FIG. 7, a pixel defining layer 180 of FIG. 8 may include the first layer 181, a second layer 182', and the third layer 183 sequentially stacked on one another. Components other than the second layer 182' of FIG. 8 are the same as those described above with reference to FIGS. 3, 6, and 7. Differences therebetween will now be focused on and described.

As shown in FIG. 8, an edge of the second layer 182' may be disposed to be a certain interval Δd apart from an edge of the first layer 181. The third layer 183 may contact the second layer 182'. An edge of the third layer 183 may directly contact a top surface of the first layer 181. A top surface and the lateral surface of the second layer 182' may be covered by the third layer 183, and a bottom surface of the second layer 182' may contact the first layer 181. The respective lateral surfaces of the first layer 181 and the third layer 183 may constitute the lateral surface of the pixel defining layer 180.

Also in the embodiment of FIG. 8, a width W1' of the second layer 182' may be greater than a width W2' of a portion of the planarization insulating layer 170 exposed between neighboring pixel electrodes 210. Thus, external light in the first wavelength band may be prevented from traveling toward the planarization insulating layer 170.

Figure 9:
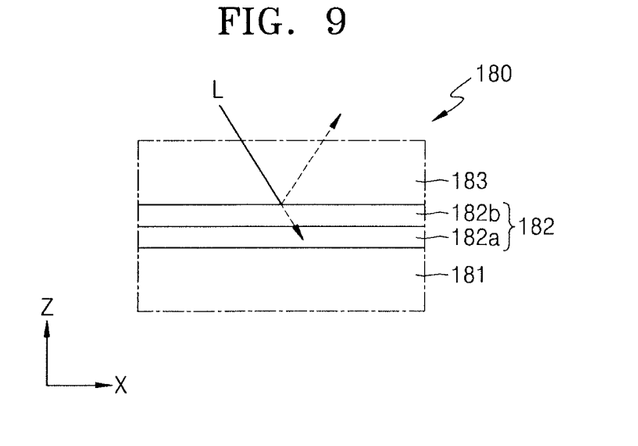
FIG. 9 illustrates a cross-sectional view of a stacked structure of a pixel defining layer according to another embodiment.

FIG. 9 illustrates a cross-sectional view of a stacked structure of a pixel defining layer according to an embodiment.

Referring to FIG. 9, a pixel defining layer 180 may includes the first layer 181, the second layer 182, and the third layer 183 sequentially stacked on one another. The second layer 182 may include a plurality of layers. In this regard, FIG. 9 illustrates the second layer 182 including a first sub-layer 182a and a second sub-layer 182b.

The second layer 182 including the first sub-layer 182a and the second sub-layer 182b may have less light transmittance in the first wavelength band than the first layer 181 and the third layer 183 as described above. A material of the first sub-layer 182a may be different from that of the second sub-layer 182b.

According to an embodiment, the second sub-layer 182b, which is an upper layer, may include a material that mainly reflects light in the first wavelength band. For example, the material of the second sub-layer 182b may be amorphous silicon. The first sub-layer 182a, which is a lower layer, may include a material that mainly absorbs light in the first wavelength band. For example, the material of the first sub-layer 182a may be an amorphous carbon-based material, excluding DLC, or chromium oxide. Most of external light L incident upon the second layer 182 having the above-described structure may be reflected by the second sub-layer 182b. Light that is not reflected by the second sub-layer 182b may be absorbed by the first sub-layer 182a. Thus, outgassing that could occur from the planarization insulating layer 170 including an organic insulating material may be effectively prevented or minimized.

The second layer 182 illustrated in FIG. 9 includes two sub-layers. In some implementations, the number of sub-layers included in the second layer 182 may vary according to materials and thicknesses.

The structure of the second layer 182 including a plurality of sub-layers, described with reference to FIG. 9, may be equally applicable to the structure of the pixel defining layer 180 described above with reference to FIGS. 3 through 8 and also to structures derived therefrom.

By way of summation and review, general organic light-emitting diodes (OLEDs) of organic light-emitting display devices may be damaged by moisture, oxygen, or impurities, such as a gas generated during or after a process of manufacturing the OLEDs. In this case, the lifespan and the quality of organic light-emitting display devices may be degraded.

According to embodiments, damage of a display element by impurities, such as a gas generated in an insulating layer, may be effectively prevented, and thus high-quality display devices may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
   an organic insulating layer;
   a pixel electrode on the organic insulating layer;
   a pixel defining layer that covers an edge of the pixel electrode, the pixel defining layer having an opening corresponding to the pixel electrode, and the pixel defining layer including a first layer including an inorganic insulating material and a second layer having less light transmittance in a first wavelength band than the first layer;
   an intermediate layer on a portion of the pixel electrode exposed via the opening, the intermediate layer including an emission layer; and
   an opposite electrode on the intermediate layer.

2. The display device as claimed in claim 1, wherein the first wavelength band is in a range of 10 nm to 400 nm.

3. The display device as claimed in claim 1, wherein the light transmittance of the second layer in the first wavelength band is 2% or less.

4. The display device as claimed in claim 1, wherein:
   the pixel electrode is a first pixel electrode, and the display device further includes a second pixel electrode neighboring the first pixel electrode, and
   a portion of the organic insulating layer exposed between the first pixel electrode and the second pixel electrode is entirely covered by the second layer.

5. The display device as claimed in claim 1, wherein the first layer includes at least one of silicon oxide and silicon nitride.

6. The display device as claimed in claim 1, wherein the second layer includes amorphous silicon.

7. The display device as claimed in claim 6, wherein the second layer includes an amorphous silicon layer having a thickness that is 1,000 Å or greater.

8. The display device as claimed in claim 1, wherein the second layer includes an amorphous carbon-based material that absorbs light in the first wavelength band, the amorphous carbon-based material excluding diamond-like carbon (DLC).

9. The display device as claimed in claim 1, wherein:
   the first layer is between the organic insulating layer and the second layer, and
   a portion of the first layer directly contacts the organic insulating layer.

10. The display device as claimed in claim 1, further comprising a third layer on the second layer, the third layer including an inorganic insulating material, wherein
the second layer is between the first layer and the third layer.

11. The display device as claimed in claim 1, wherein:
the second layer includes a first sub-layer and a second sub-layer, and
a sub-layer closer to the organic insulating layer from among the first sub-layer and the second sub-layer has a larger light absorption rate than the other sub-layer.

\* \* \* \* \*